United States Patent
Su et al.

(10) Patent No.: US 6,414,532 B1
(45) Date of Patent: Jul. 2, 2002

(54) GATE GROUND CIRCUIT APPROACH FOR I/O ESD PROTECTION

(75) Inventors: Hung Der Su, Sheh-Chung; Jian-Hsing Lee; Yi-Hsun Wu, both of Hsin-Chu; Mau-Lin Wu, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/963,596

(22) Filed: Sep. 27, 2001

(51) Int. Cl.[7] ................................................ H03K 5/08
(52) U.S. Cl. ......................... 327/310; 327/314; 327/325
(58) Field of Search .............................. 327/309, 310, 327/313, 314, 324, 325, 327, 328; 361/58, 90, 115

(56) References Cited

U.S. PATENT DOCUMENTS

| | | | |
|---|---|---|---|
| 5,572,394 A | 11/1996 | Ker et al. ..................... | 361/56 |
| 5,804,861 A | 9/1998 | Leach ........................ | 257/362 |
| 5,831,466 A | * 11/1998 | Pulvirenti et al. ........... | 327/309 |
| 5,852,375 A | 12/1998 | Byrne et al. ................. | 327/108 |
| 6,005,413 A | 12/1999 | Schmitt ....................... | 326/80 |
| 6,008,974 A | * 12/1999 | Lee et al. .................... | 361/111 |
| 6,028,450 A | 2/2000 | Nance ......................... | 326/81 |
| 6,049,119 A | 4/2000 | Smith ......................... | 257/575 |
| 6,097,071 A | 8/2000 | Krakauer ..................... | 257/395 |
| 6,271,999 B1 | * 8/2001 | Lee et al. .................... | 361/56 |

* cited by examiner

Primary Examiner—Toan Tran
Assistant Examiner—An T. Luu
(74) Attorney, Agent, or Firm—George O. Saile; Stephen B. Ackerman

(57) ABSTRACT

An I/O ESD protection circuit is provided utilizing a driver circuit, an ESD protection circuit, a Vcc/Vss protection circuit, and a clamping circuit. The driver circuit and the ESD protection circuit each comprise a NMOS cascode circuit. NMOS transistors and biasing resistive means comprise the Vcc/Vss protection circuit. The clamping circuit is a diode coupled between the I/O pad of the protection circuit and the gate of that NMOS transistor. In an ESD event the diode turns on the NMOS transistor of the Vcc/Vss protection circuit, thus clamping off the first transistor of both NMOS cascode circuits. The clamping inhibits the gate of those first two transistors to be coupled up by an ESD voltage and creates a parasitic bipolar transistor in each cascode circuit. The parasitic bipolar transistors provide a uniform current flow in the buried area of the P-well of both NMOS cascode circuits.

23 Claims, 3 Drawing Sheets

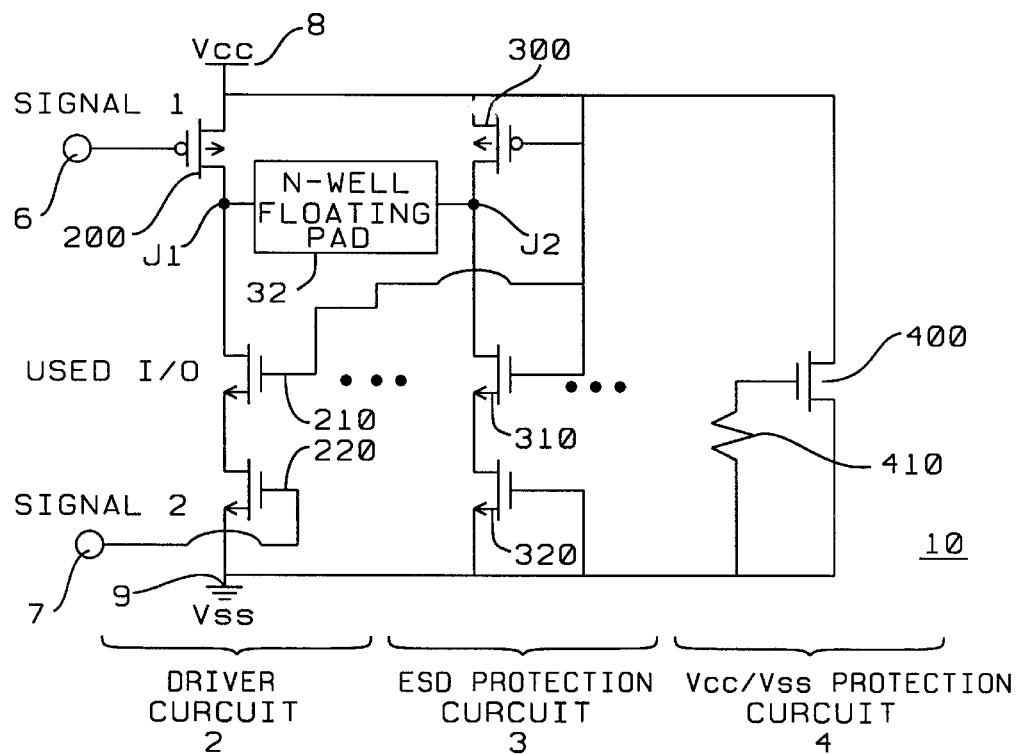
FIG. 1 - Prior Art
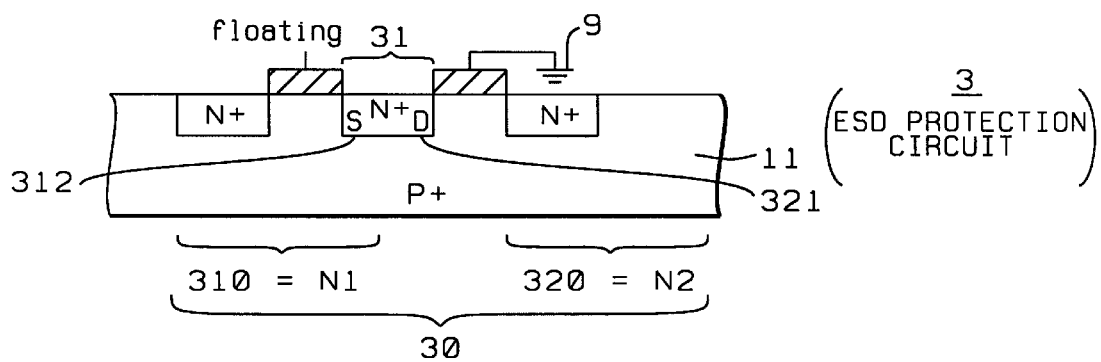
FIG. 2a - Prior Art

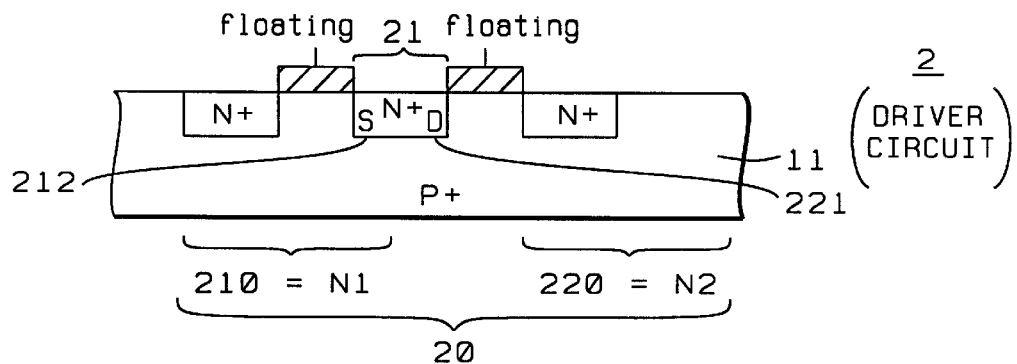
FIG. 2b - Prior Art
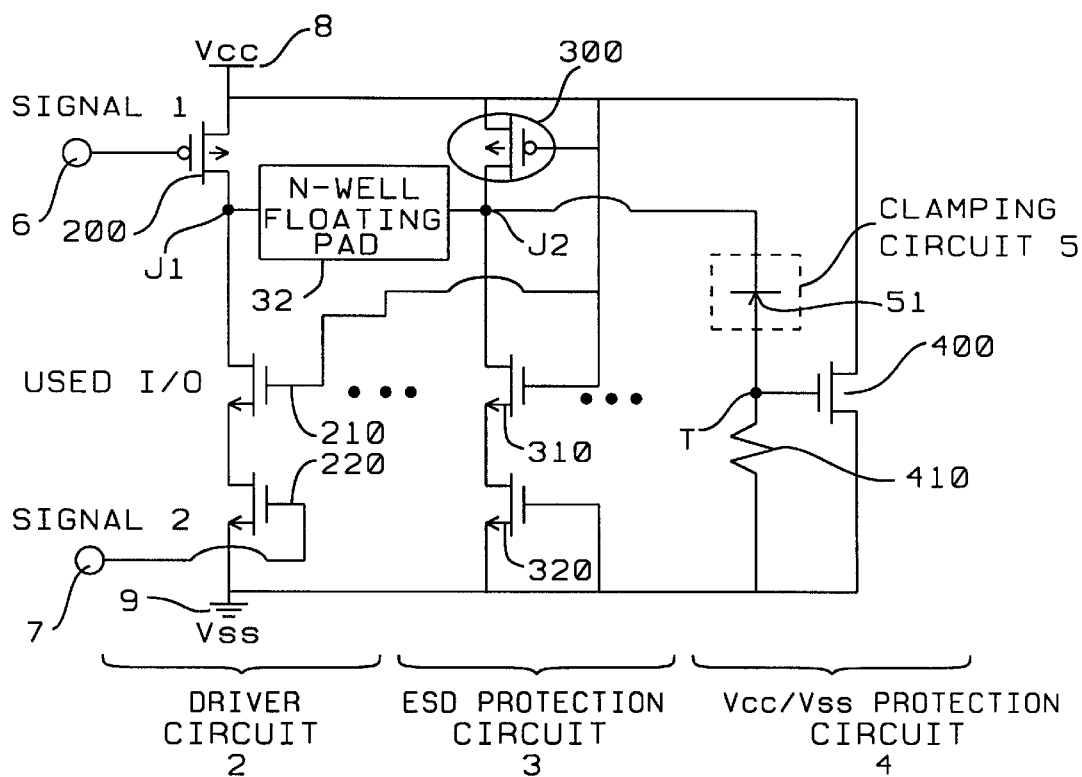
FIG. 3

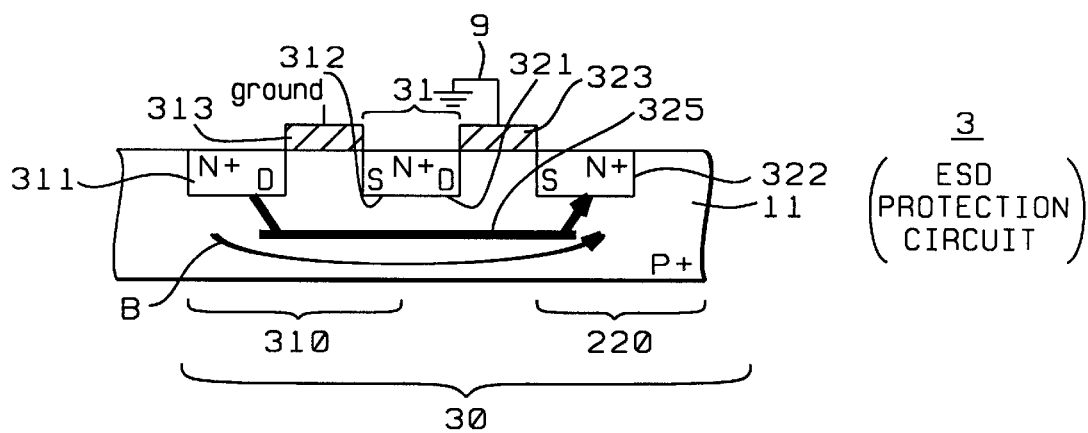
FIG. 4a – Prior Art
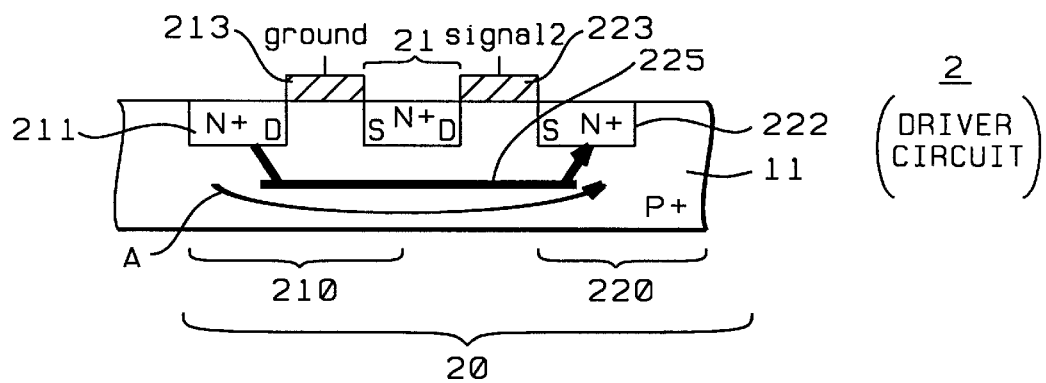
FIG. 4b – Prior Art

GATE GROUND CIRCUIT APPROACH FOR I/O ESD PROTECTION

BACKGROUND OF THE INVENTION

1. Field of the Invention

The invention relates to the protection of integrated circuits from electrostatic discharge (ESD), and more particularly to the method of providing substrate current flow in an NMOS cascode circuit in an ESD event.

2. Description of the Related Art

In the present conventional 5VT Input/Output (I/O) circuit structure for ESD protection where two NMOS cascode circuits are used, the protection from ESD is diminished because current flow, caused by an ESD, is impeded in the NMOS cascode circuits. While the first NMOS transistor of each NMOS cascode circuit is on—caused by the coupling up of an ESD pulse into its gate—the second NMOS transistor of the second NMOS cascode circuit is off. The resulting current non-uniformity between the NMOS cascode circuits causes the device to fail at low ESD zapping voltages. FIG. 1 is a depiction of such a circuit of the prior art which will be described next.

Circuit 10 of FIG. 1 comprises at least one driver circuit 2, ESD protection circuit 3, and Vcc/Vss protection circuit 4. Driver circuit 2 has input 6 which couples to the gate of PMOS transistor 200, and input 7 which couples to the gate of NMOS transistor 220. Connected in series between voltage supply 8 and reference potential 9 (typically ground) are PMOS transistor 220, and NMOS transistors 210 and 220. The gate of transistor 210 is coupled to voltage supply 8, and the junction J1 of transistors 200 and 210 is connected to I/O pad 32. ESD protection circuit 3 comprises, in series between voltage supply 8 and reference potential 9, PMOS transistor 300, and NMOS transistors 310 and 320, respectively. The gates of transistors 300 and 310 are coupled to voltage supply 8, and the gate of transistor 320 is coupled to reference potential 9. The junction J2 between transistors 300 and 310 is coupled to I/O pad 32. Vcc/Vss protection circuit 4 is coupled in series between voltage supply 8 and reference potential 9. Typically Vcc/Vss protection circuit 4 comprises a plurality of NMOS transistors 400 and resistive means 410, where the latter are coupled between the gates of NMOS transistors 400 and reference potential 9. The drains and sources of transistors 400 are coupled to voltage supply 8 and reference potential 9, respectively.

Referring now to FIG. 1, FIG. 2a, and FIG. 2b, we continue with the description of the prior art circuit. NMOS transistors 210 and 220 form a cascode circuit 20 where the source 212 of transistor 210 and the drain 221 of transistor 220 share a diffusion region 21. Similarly, NMOS transistors 310 and 320 form a cascode circuit 30 where the source 312 of transistor 310 and the drain 321 of transistor 320 share a diffusion region 31. NMOS transistor 210 and NMOS transistor 310 are customarily called the "first transistor" or "N1" of each cascode circuit, and transistors 220 and 320 are called the "second transistor" or "N2."

The problem with the circuit of FIG. 1 is that the voltage at the gate of NMOS transistors 210, 220 and 310 will be coupled up by an ESD pulse because these gates are in effect floating with respect to an ESD (when transistor 400 is off then the gates of transistors 210 and 310 are in effect floating, therefore, the gate voltage of transistors 210 and 310 will be coupled up by the drain voltage of 210 and 310, respectively). Therefore, the ESD pulse will travel at the surface of NMOS transistors 210 and 220 (in the n-channel). In the second cascode circuit, the gate of NMOS transistor 320 is connected to ground and, therefore, off (no n-channel) during an ESD while transistor 310 is on. Thus, the ESD pulse cannot travel at the surface of NMOS transistors 310 and 320. Hence, ESD protection will fail at low ESD voltages because of the current non-uniformity between driver circuit 2 and ESD protect circuit 3.

Prior art U.S. Patents which relate to the subject of ESD protection are:

U.S. Pat. No. 5,572,394 (Ker et al.) CMOS On-Chip Four-LVTSCR ESD Protection Scheme.
U.S. Pat. No. 5,804,861 (Leach) Electrostatic Discharge Protection in Integrated Circuits, Systems and Methods.
U.S. Pat. No. 5,852,375 (Byrne et al.) 5V Tolerant I/O Circuit.
U.S. Pat. No. 67005,413 (Schmitt) 5V Tolerant PCI I/O Buffer on 2.5'V Technology.
U.S. Pat. No. 6,028,450 (Nance) Programmable Input/Output Circuit with Pull-Up Bias Control.
U.S. Pat. No. 6,049,119 (Smith) Protection Circuit for a Semiconductor Device.
U.S. Pat. No. 67097,071 (Krakauer) ESD Protection Clamp for Mixed Voltage I/O Stages Using NMOS Transistors.

While above U.S. Patents offer various circuits and methods of protecting devices from destructive ESD, none of them use a clamping circuit to pull down to ground (reference potential) the first poly gate of each cascode circuit. The proposed circuit improves the ESD performance and eliminates the non-uniform current distribution in the cascode circuits of the prior art.

SUMMARY OF THE INVENTION

It is an object of the present invention to improve the ESD performance of the I/O ESD protection circuit.

It is another object of the present invention to create a uniform current flow between the first and the second NMOS cascode circuit.

It is yet another object of the present invention to force the gates of the first NMOS transistors to near ground (reference potential).

It is still another object of the present invention to improve the ESD performance with a minimal change to the I/O ESD protection circuit.

These and many other objects have been achieved by providing the I/O ESD protection circuit with driver circuits, ESD protection circuits, a Vcc/Vss protection circuit with a plurality of NMOS transistors, and by adding clamping circuits between the I/O pad of the ESD protection circuit and the Vcc/Vss protection circuit. Clamping circuits are implemented typically by a diode which has its cathode coupled to the I/O pad. NMOS cascode circuits of each driver circuit and each ESD protection circuit react to an ESD by having their first poly gates pulled down to ground by each clamping circuit. This clamping action prevents the gate voltage of the first NMOS transistor of the NMOS cascode circuits to be coupled up by an ESD pulse. This clamping action creates a current flow from the drain of the first NMOS transistor through the P-well to the source of the second NMOS transistor of each of the NMOS cascode circuits and, thus, prevents device failure at low ESD voltages. The current flow through the P-well is made possible by the action of a parasitic bipolar npn transistor which is created by the N+ drain (collector) of the first NMOS transistor, the P-well (base), and the N+ source (emitter) of the second NMOS transistor of both NMOS cascode circuits. The parasitic bipolar npn transistor is created when the poly gate of the first transistor is clamped to ground.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a circuit diagram of the prior art.

FIG. 2a is a schematic cross-section of the cascode circuit part of the ESD protection circuit of FIG. 1.

FIG. 2b is a schematic cross-section of the cascode circuit part of the driver circuit of FIG. 1.

FIG. 3 is a circuit diagram of the preferred embodiment of the present invention.

FIG. 4a is a schematic cross-section of the cascode circuit part of the ESD protection circuit of FIG. 3.

FIG. 4b is a schematic cross-section of the cascode circuit part of the driver circuit of FIG. 3.

DESCRIPTION OF THE PREFERRED EMBODIMENT

The present invention provides a very successful solution to the problems of the circuit of the prior art by adding at least one clamping circuit to the circuit of FIG. 1, such that NMOS gates of driver circuit 2 and ESD protection circuit 3 become grounded during an ESD event. Referring now to FIG. 3, FIG. 4a, and FIG. 4b, we begin a description of the preferred circuit of the present invention. Note that the same numerals in FIGS. 1, 2a, 2b, 3, 4a, and 4b designate the same components. The gate ground circuit 30 for I/O electrostatic discharge (ESD) comprises at least one driver circuit 2, ESD protection circuit 3, Vcc/Vss protection circuit 4, and clamping circuit 5.

Referring now to FIG. 3 and FIG. 4b, each driver circuit 2 has at least one input, but typically two (inputs 6 and 7, with Signal 1 and Signal 2 applied, respectively), and an output J1, which is coupled to I/O pad 32 (Signal 2 is typically the inverse of Signal 1). Driver circuit 2 is further in communication with voltage supply 8 and reference potential 9 (typically ground). Each driver circuit 2 comprises PMOS transistor 200 in series with first and second NMOS transistors 210 and 220. Transistors 210 and 220 are part of a first NMOS cascode circuit 20. The source of transistor 200 is in communication with voltage supply 8, and its drain is coupled to the drain 211 of transistor 210. The gate of transistor 200 is coupled to input 6. The junction J1 of transistors 200 and 210 (drain of transistor 200 and drain of transistor 210) couples to I/O pad 32. The gate 213 of transistor 210 is in communication with voltage supply 8. The source 212 of transistor 210 connects to the drain 221 of transistor 220. The gate 223 of transistor 220 couples to input 7. The source 222 of transistor 220 is coupled to reference potential 9. Referring specifically to FIG. 4b, note that source 212 and drain 221 share the same active area 21 of the P-well 11.

ESD protection circuit 3, in communication with voltage supply 8 and reference potential 9, and further coupled to I/O pad 32, provides protection from ESD. Referring to FIG. 3 and FIG. 4a, each ESD protection circuit 3 comprises PMOS transistor 300 in series with first and second NMOS transistors 310 and 320. Transistors 310 and 320 are part of a second NMOS cascode circuit 30. The source of transistor 300 is in communication with voltage supply 8, and its drain is coupled to the drain 311 of transistor 310. The gate of transistor 300 is coupled to voltage supply 8. The junction J2 of transistors 300 and 310 (drain of transistor 300 and drain of transistor 310) couples to I/O pad 32. The gate 313 of transistor 310 is coupled to voltage supply 8. The source 312 of transistor 310 couples to the drain 321 of transistor 320. The gate 323 of transistor 320 is in communication with reference potential 9. The source 322 of transistor 320 is coupled to reference potential 9. Referring specifically to FIG. 4a, note that source 312 and drain 321 share the same active area 31 of the P-well 11.

Vcc/Vss protection circuit 4 is in communication with voltage supply 8 and reference potential 9. Vcc/Vss protection circuit 4 typically comprises a plurality of NMOS transistors 400 and resistive means 410. The drains of transistors 400 are in communication with voltage supply 8, the gates are coupled to terminal T, and the sources of transistors 400 and one side of resistive means 410 couple to reference potential 9. The other side of resistive means 410 couples to terminal T. Vcc/Vss protection circuit 4 provides further protection from ESD because transistors 400 go into controlled conduction upon being subjected to ESD.

Still referring to FIG. 3, FIG. 4a, and FIG. 4b, each clamping circuit 5, coupled between I/O pad 32 and terminal T of Vcc/Vss protection circuit 4, typically comprises a diode 51, where the cathode of diode 51 couples to I/O pad 32 and the anode couples to terminal T. The anode and cathode of Diode 51 are typically created by a P+ and an N+ region in an N-well (not shown). When the voltage of the ESD is high enough diode 51 will become reverse biased and conduct (zener effect). Current flowing through resistive means 410 will cause the voltage at terminal T to rise. Therefore, NMOS transistor 400 will turn on and its drain will be pulled to near ground (reference potential 9), thereby grounding gates 213 and 313 and turning off transistors 210 and 310. ESD current is now forced to flow through parasitic bipolar npn transistors 225 and 325 of the first NMOS cascode circuit 20 and second NMOS cascode circuit 30, respectively. Each of these parasitic bipolar npn transistors is created by the N+ diffusions of drains 211 and 311 acting as collectors of the parasitic bipolar npn transistors 225 and 325, respectively, the P-well 11 acting as base, and the N+ diffusions of sources 222 and 322 acting as emitters. More specifically, current flows from the drain 211 of first NMOS transistor 210 through the buried area of P-well 11 to the source 222 of second NMOS transistor 220 (driver circuit 2). The current, as identified by arrow A, is conducted by parasitic, bipolar transistor 225 turning on. Similarly, current flows from the drain 311 of first NMOS transistor 310 through the buried area of P-well 11 to the source 322 of second NMOS transistor 320 (ESD protection circuit 3). The current, as identified by arrow B, is conducted by bipolar transistor 325 turning on. Thus, the uniform current between driver circuit 2 and ESD protect circuit 3 improves the ESD performance of gate ground circuit 30.

Advantages of the present invention are that by adding a clamping circuit (typically a diode) to the circuit of the prior art the first poly gate of an NMOS cascode circuit gets grounded in an ESD event. The grounded first poly gate a) prevents the gates of the first NMOS transistors 210 and 310 from getting coupled up to high by the drain voltage of 210 and 310, respectively, and b) creates a uniform current flow from the drain of the first transistor through the P-well to the source of the second transistor of each NMOS cascode circuit.

While the invention has been particularly shown and described with reference to the preferred embodiments thereof, it will be understood by those skilled in the art that various changes in form and details may be made without departing from the spirit and scope of the invention.

What is claimed is:

1. A gate ground circuit for I/O electrostatic discharge (ESD), comprising:
    a substrate comprising a P-well and an N-well, said P-well having N+ doped active areas;
    at least one driver circuit deposited in said P-well, said driver circuit having one or more inputs and an output, said output coupled to an I/O pad, said driver circuit in communication with a voltage supply and a reference potential, said driver circuit used to apply signals to said one or more inputs;
    at least one ESD protection circuit deposited in said P-well, said ESD protection circuit in communication with said voltage supply and said reference potential, said ESD protection circuit further coupled to said I/O pad, said ESD protection circuit providing protection from ESD;
    at least one Vcc/Vss protection circuit deposited in said P-well, said Vcc/Vss protection circuit in communication with said voltage supply and said reference potential, said Vcc/Vss protection circuit comprising an NMOS transistor and resistive means, the gate of said NMOS transistor and one end of said resistive means having a common terminal T, the other end of said resistive means coupled to said reference potential, said Vcc/Vss protection circuit providing further protection from said ESD voltages by causing said NMOS transistor to go into controlled conduction; and
    at least one clamping circuit coupled between said I/O pad and said terminal T, where, upon receiving an ESD, said clamping circuit pulls down to said reference potential a gate of one of said MOS transistors in said driver circuit and in said ESD protection circuit, thus improving the tolerance of said gate ground circuit to ESD through uniform ESD current distribution in said driver circuit and ESD protection circuit.

2. The circuit of claim 1, wherein said driver circuit further comprises:
    a PMOS transistor and a first and second cascoded NMOS transistor all serially coupled together, where the source of said PMOS transistor is in communication with said voltage supply, where the source of said second cascoded NMOS transistor is coupled to said reference potential, where the gate of said PMOS transistor is coupled to said first input, where the gate of said first cascoded NMOS transistor is in communication with said voltage supply, where the gate of said second cascoded NMOS transistor is coupled to said second input, and where the junction of said PMOS transistor and said first cascoded NMOS transistor is coupled to said output.

3. The circuit of claim 2, wherein the source of said first and the drain of said second cascoded NMOS transistor of said driver circuit share a diffusion region merged in said same N+ doped active area of said P-well.

4. The circuit of claim 1, wherein said ESD protection circuit further comprises:
    a PMOS transistor and a first and a second cascoded NMOS transistor all serially coupled together, where the source of said PMOS transistor is in communication with said voltage supply and where the source of said second cascoded NMOS transistor is coupled to said reference potential, where the gate of said PMOS transistor and the gate of said first cascoded NMOS transistor are in communication with said voltage supply, where the gate of said second cascoded NMOS transistor is coupled to said reference potential, and where the junction of said PMOS transistor and said first cascoded NMOS transistor are coupled to said output.

5. The circuit of claim 4, wherein the source of said first and the drain of said second cascoded NMOS transistor of said ESD protection circuit share a diffusion region merged in said same N+ doped active area of said P-well.

6. The circuit of claim 1, wherein said NMOS transistor of said Vcc/Vss protection circuit is comprised of a drain, a source and a gate, the drain and source of said NMOS transistor in communication with said voltage supply and said reference potential, respectively, and said gate of said NMOS transistor of said Vcc/Vss protection circuit coupled to said terminal T.

7. The circuit of claim 1, wherein said clamping circuit is comprised of a diode having an anode and a cathode, where said cathode is coupled to said I/O pad and said anode is coupled to said terminal T.

8. The circuit of claim 7, wherein said anode and said cathode of said diode are created by a P+ and an N+ diffusion in said N-well, respectively.

9. The circuit of claim 1, wherein said clamping circuit, upon receiving an ESD, forces the gate of said first cascoded NMOS transistor of said driver circuit to the level of said reference potential, thus forcing a current flow from the drain of said first cascoded NMOS transistor of said driver circuit to the source of said second cascoded NMOS transistor of said driver circuit.

10. The circuit of claim 9, wherein said uniform current flows through a buried area of said P-well of said driver circuit.

11. The circuit of claim 1, wherein said clamping circuit, upon receiving an ESD, forces the gate of said first cascoded NMOS transistor of said ESD protection circuit to the level of said reference potential, thus forcing a current flow from the drain of said first cascoded NMOS transistor of said ESD protection circuit to the source of said second cascoded NMOS transistor of said ESD protection circuit.

12. The circuit of claim 11, wherein said uniform current flows through a buried area of said P-well of said ESD protection circuit.

13. A gate ground circuit for I/O electrostatic discharge (ESD), comprising:
    a substrate comprising a P-well and an N-well, said P-well having N+ doped active areas;
    at least one driver circuit, deposited in said P-well, having a first and a second input and an output, said output coupled to an I/O pad, said driver circuit used to gate a first and a second signal applied to said first and said second input, said driver circuit comprising a first PMOS transistor in series with a first NMOS cascode circuit, the gate of said first PMOS transistor coupled to said first input of said driver circuit, said first PMOS transistor in communication with a voltage supply, said first NMOS cascode circuit coupled to a reference potential, where the junction of said first PMOS transistor and said first NMOS cascode circuit couples to said output, said driver circuit providing increased immunity from ESD voltages by creating a uniform current flow in said first NMOS cascode circuit;
    at least one ESD protection circuit, deposited in said P-well, said ESD protection circuit comprising a second PMOS transistor in series with a second NMOS cascode circuit, said second PMOS transistor in communication with said voltage supply, said second NMOS cascode circuit coupled to said reference potential, where the junction of said second PMOS transistor and said second NMOS cascode circuit couples to said output, said ESD protection circuit providing increased immunity from ESD voltages by creating a uniform current flow in said second NMOS cascode circuit;

at least one Vcc/Vss protection NMOS transistor, deposited in said P-well, said Vcc/Vss protection NMOS transistor in communication with said voltage supply and said reference potential, the gate of said Vcc/Vss protection NMOS transistor coupled via resistive means to said reference potential, said Vcc/Vss protection NMOS transistor providing protection from said ESD voltages by going into controlled conduction; and at least one clamping circuit coupled between said I/O pad and said gate of said Vcc/Vss protection NMOS transistor, where said clamping circuit, upon receiving an ESD causes said Vcc/Vss protection NMOS transistor to turn on, thus pulling down to said reference potential a first gate of said first and said second NMOS cascode circuit, thus forcing a uniform current flow in the buried area of said P-well of said first and said second NMOS cascode circuit, thereby improving the ESD performance of said gate ground circuit.

14. The circuit of claim 13, wherein said first NMOS cascode circuit further comprises a first and a second NMOS transistor coupled in series, each of said NMOS transistors having a drain, a source and a gate, where said gate of said first NMOS transistor is in communication with said voltage supply, and where said gate of said second NMOS transistor is coupled to said second input of said driver circuit.

15. The circuit of claim 14, wherein said source and said drain of said first and second NMOS transistor, respectively, of said first NMOS cascode circuit share a diffusion region merged in the same N+ doped active area of said P-well.

16. The circuit of claim 13, wherein said second NMOS cascode circuit further comprises a first and a second NMOS transistor coupled in series, each of said NMOS transistors having a drain, a source and a gate, where the gate of said second PMOS transistor and said gate of said first NMOS transistor are in communication with said voltage supply, and where said gate of said second NMOS transistor couples to said reference potential.

17. The circuit of claim 16, wherein said source and said drain of said first and second NMOS transistor, respectively, of said second NMOS cascode circuit share a diffusion region merged in the same N+ doped active area of said P-well.

18. The circuit of claim 13, wherein said clamping circuit is comprised of a diode having an anode and a cathode, where said cathode is coupled to said I/O pad and said anode is coupled to said gate of said Vcc/Vss protection NMOS transistor.

19. The circuit of claim 18, wherein said anode and said cathode of said diode are created by a P+ and an N+ diffusion in said N-well, respectively.

20. The circuit of claim 14, wherein said clamping circuit, upon receiving an ESD, forces said gate of said first NMOS transistor of said first NMOS cascode circuit to the level of said reference potential, thereby turning on a first parasitic bipolar npn transistor created by said drain of said first NMOS transistor of said first NMOS cascode circuit, said P-well, and said source of said second NMOS transistor of said first NMOS cascode circuit.

21. The circuit of claim 20, wherein turning on said first parasitic bipolar npn transistor forces said uniform current flow from said drain of said first NMOS transistor of said first NMOS cascode circuit through said buried area of said P-well of said driver circuit to said source of said second NMOS transistor of said first NMOS cascode circuit.

22. The circuit of claim 16, wherein said clamping circuit, upon receiving an ESD, forces said first input of said second NMOS cascode circuit to the level of said reference potential, thereby turning on a second parasitic bipolar npn transistor created by said drain of said first NMOS transistor of said second NMOS cascode circuit, said P-well, and said source of said second NMOS transistor of said second NMOS cascode circuit.

23. The circuit of claim 22, wherein turning on said second parasitic bipolar npn transistor forces said uniform current flow from said drain of said first NMOS transistor of said second NMOS cascode circuit through said buried area of said P-well of said ESD protection circuit to said source of said second NMOS transistor of said second NMOS cascode circuit.

* * * * *